United States Patent [19]

Chemla et al.

[11] 4,320,178

[45] Mar. 16, 1982

[54] STRUCTURE OF THE INSULATOR—SEMICONDUCTOR TYPE

[76] Inventors: Daniel Chemla, 50 Ave. Jean Jaurès, 92290 Chatenay Malabry; Louis Cot, Residence Les Pins No. 3 - Clapiers, 34170 Castelnau le Lez; Jean Jerphagnon, 38, rue de Kerrazion, 22560 Trebeurden; Jean Durand, Mas Drevon H3, Rue J.R. de Comminges, 34100 Montpellier, all of France

[21] Appl. No.: 136,568

[22] Filed: Apr. 2, 1980

[30] Foreign Application Priority Data

Apr. 10, 1979 [FR] France ................................ 79 09044

[51] Int. Cl.$^3$ ............................................ H01L 21/18
[52] U.S. Cl. ...................................... 428/698; 357/23; 357/61; 427/82; 427/87; 428/699; 428/700
[58] Field of Search ............... 427/82, 86, 87; 357/61, 357/23; 148/33.4, 33.3, 6.3; 423/561 R; 428/699, 700, 698

[56] References Cited

U.S. PATENT DOCUMENTS 3,290,181 12/1966 Sirtl ..................................... 156/613
3,519,492 7/1970 Huml et al. ...................... 357/61 X
3,914,784 10/1975 Hunsperger et al. ................ 357/61

FOREIGN PATENT DOCUMENTS 51-20154 6/1976 Japan .................................... 357/61

OTHER PUBLICATIONS

Janssen et al., "Sulfurization Technique for Stabilizing Germanium Surfaces", The Review of Scientific Instruments, vol. 42, No. 11, pp. 1667–1669, Nov. 1979.

*Primary Examiner*—John D. Smith
*Assistant Examiner*—Bernard F. Plantz
*Attorney, Agent, or Firm*—Lane, Aitken, Kice & Kananen

[57] ABSTRACT

Structure of the insulator—semiconductor type constituted by a semiconducting crystalline substrate formed from a III–V compound of formula ($A^{III}B^V$) coated with an insulating layer, wherein the substrate has a specific crystalline orientation and wherein the insulator is a sulphide in accordance with the formula ($A^{III}B^V$)$S_4$.

It also relates to a process for the preparation of such a structure.

Applications of the invention occur in the fields of microelectronics and optoelectronics.

6 Claims, No Drawings

STRUCTURE OF THE INSULATOR—SEMICONDUCTOR TYPE

BACKGROUND OF THE INVENTION

The present invention relates to a structure of the insulator—semiconductor type in which the semiconductor is a III-V compound and to processes for the production of said structure. It can be used on the one hand in microelectronics where it permits the production of high performance (speed, degree of integration, etc) components of the MIS type (metal—insulator—semiconductor) and on the other hand in optoelectronics where it permits the passivation of the surfaces of optoelectronic components, e.g. semiconducting lasers.

For some years now, an increasing importance and interest has been attached to composite semiconductors of the III-V type (e.g. GaAs or InP). These materials have in fact remarkable properties making them particularly suitable for the construction of integrated electronic components of the MIS type, where they lead to a considerable improvement in performance figures compared with conventional components based on silicon and germanium. Among these properties, particular reference is made to the high electronic mobility (approximately 10,000 cm/s for the GaAs and 5,000 for InP, as compared with only 1,200 for Si and 3,600 for Ge), the forbidden band width (approximately 1.4 eV compared with 1.1 eV for Si and 0.7 eV for Ge) and the high resistivity (approximately $10^6$ Ωcm).

However, hitherto the hopes set on III-V compounds have not been crowned with success due more particularly to the fact that it has proved very difficult to make a suitable interface between the insulator and the semiconductor. Attempts have been made to deposit insulators such as $SiO_2$, $Al_2O_3$, $Si_3N_4$, $Ge_2N$, GaN, etc . . . , but the electrical characteristics (current—voltage, capacitance—voltage, interface charges) obtained for these insulator—semiconductor interfaces do not provide the necessary high quality for the construction of MIS components.

BRIEF SUMMARY OF THE INVENTION

The present invention relates to an insulator—semiconductor structure, which obviates this disadvantage.

More specifically, the present invention relates to a structure of the insulator—semiconductor type constituted by a semiconducting crystalline substrate formed from a III-V compound of formula $(A^{III}B^V)$ coated with an insulating layer, wherein the substrate has a specific crystalline orientation and wherein the insulator is a sulphide in accordance with the formula $(A^{III}B^V)S_4$.

According to a first variant, the invention firstly applies to the standard compounds of this group, namely GaAs and InP, but also to compounds derived therefrom, for example $GaAs_{1-x}P_x$ in which x is below 1.

DETAILED DESCRIPTION OF THE PREFERRED EMBODIMENTS

The both theoretical and experimental work carried out by the Applicants make it possible to attempt to interpret the reason for the remarkable qualities obtained by the structure according to the invention.

The Applicants have found that the sulphide $(A^{III}B^V)S_4$ in making insulator—semiconductor interfaces plays a privileged role compared with the prior art insulators, because the molecular structure of this material is identical to that of the substrate. In the present case, it is a tetrahedral structure. Thus, the actual environment of the substrate is maintained during its passivation.

However, the prior art insulators do not have this tetrahedral structure and their use inevitably leads to the fracture in the interface, resulting in the appearance of electrical charges which compensate the irregularities in the chemical composition.

However, the structural continuity obtained with the sulphide $(A^{III}B^V)S_4$ recommended by the invention leads to a much lower density of residual charges at the interface, which is very favorable in the application of microelectronics.

Thus, the choice of the sulphide $(A^{III}B^V)S_4$ for passivating a semiconducting substrate $(A^{III}B^V)$ is not only a question of the chemical composition. This choice is dictated by much more complex considerations connected with the intimate functioning of semiconductor structures of the insulator—semiconductor type.

Naturally, the above interpretation is only given in an explanatory manner and the scope of the invention is in no way dependent thereon.

It should also be noted that the use of the sulphide recommended by the invention leads to a supplementary advantage compared with oxide—semiconductor structures in optoelectronics, because in the latter case the oxygen involved in the passivation process constitutes a very active trap in the semiconductor, which is prejudicial to the efficiency of the apparatus.

The present invention also relates to processes for the preparation of the structure defined hereinbefore.

According to a first process a semiconducting crystalline substrate of formula $A^{III}B^V$ and particular crystalline orientation is prepared, this substrate is placed in a flask containing sulphur or hydrogen sulphide, the flask is placed in an oven, the flask is heated to a temperature of approximately 400° C., this temperature is maintained for the time necessary for obtaining a desired sulphide thickness, the temperature is returned to ambient temperature and the substrate is removed from the flask.

According to a second process, a semiconducting crystalline substrate of formula $(A^{III}B^V)$ and crystalline orientation 110 is prepared, this substrate is placed in a flask containing the sulphide $(A^{III}B^V)S_4$ and a thermal gradient is applied to the flask to bring about a vapour phase transfer of $(A^{III}B^V)S_4$ to $(A^{III}B^V)$. It is pointed out that hereinbefore the crystalline orientation can for example be orientation 110.

What is claimed is:

1. A structure of the insulator-semiconductor type comprising a semiconducting crystalline substrate formed from a III-V compound of formula $(A^{III}B^V)$ coated with an insulating layer, wherein the insulating layer is a sulphide in accordance with the formula $(A^{III}B^V)S_4$.

2. A structure of the insulator—semiconductor type according to claim 1, wherein the semiconductor is a compound GaAs.

3. A structure of the insulator—semiconductor type according to claim 1, wherein the semiconductor is the compound InP.

4. A structure of the insulator—semiconductor type according to claim 1, wherein the crystalline orientation of the substrate is orientation (110).

5. A process for the preparation of the structure according to claim 1, wherein a semiconducting crystalline substrate of formula $A^{III}B^{V}$ is prepared, this substrate is placed in a flask containing sulphur or hydrogen sulphide, the flask is placed in an oven, the flask is heated to a temperature of approximately 400° C., this temperature is maintained for the time necessary for obtaining a desired sulphide thickness, the temperature is returned to ambient temperature and the substrate is removed from the flask.

6. A process according to claim 5, wherein the semiconducting crystalline substrate has a crystalline orientation of 110.

* * * * *